United States Patent [19]
Baumgartner et al.

[11] Patent Number: 6,134,684
[45] Date of Patent: Oct. 17, 2000

[54] METHOD AND SYSTEM FOR ERROR DETECTION IN TEST UNITS UTILIZING PSEUDO-RANDOM DATA

[75] Inventors: Jason Raymond Baumgartner; Kenneth Douglas Klapproth, both of Austin; David Mui, Round Rock, all of Tex.

[73] Assignee: International Business Machines Corporation, Armonk, N.Y.

[21] Appl. No.: 09/030,972

[22] Filed: Feb. 25, 1998

[51] Int. Cl.⁷ .................................................. G01R 31/28
[52] U.S. Cl. ............................................ 714/724; 714/728
[58] Field of Search .................................... 714/728, 739, 714/742–744, 724, 737, 736, 735; 365/201; 324/73.1

[56] References Cited

U.S. PATENT DOCUMENTS

| | | | |
|---|---|---|---|
| 4,049,956 | 9/1977 | Van Veen ................................. | 235/153 |
| 4,077,028 | 2/1978 | Lui et al. ............................. | 340/146.1 |
| 4,658,400 | 4/1987 | Brown et al. ........................... | 714/736 |
| 4,775,977 | 10/1988 | Dehara .................................... | 714/738 |
| 4,870,346 | 9/1989 | Mydill et al. ............................. | 324/73 |
| 4,926,426 | 5/1990 | Scheuneman et al. ................. | 371/40.1 |
| 5,001,712 | 3/1991 | Splett et al. ............................. | 714/703 |
| 5,081,666 | 1/1992 | Blaschek et al. ........................... | 379/5 |
| 5,173,906 | 12/1992 | Dreibelbis et al. .................... | 371/22.5 |
| 5,313,627 | 5/1994 | Amini et al. ................................ | 714/2 |
| 5,499,346 | 3/1996 | Amini et al. .......................... | 714/45 X |
| 5,550,988 | 8/1996 | Sarangdhar et al. .................. | 714/48 X |
| 5,553,082 | 9/1996 | Connor et al. .......................... | 371/25.1 |

*Primary Examiner*—Hoa T. Nguyen
*Attorney, Agent, or Firm*—Volel Emile; Felsman, Bradley, Vaden, Gunter & Dillon, LLP

[57] ABSTRACT

A method and system in an integrated circuit for the detection of defects within integrated circuits and planars are disclosed. Initially, pseudo-random data is generated. Thereafter, the pseudo-random data is transferred to a bus interface unit that determines, based upon the pseudo-random data, a particular transaction that may be injected upon a test unit by the bus interface unit. Expected results of all types of transactions that may be injected upon the test unit are predetermined. The particular transaction is then injected upon the test unit. Such transactions can include transactions such as a bus store or bus load. The results of the particular transaction upon the test unit are then compared with the expected results, wherein a mismatch between the expected results and the results of the particular transaction upon the test unit exposes an error within the test unit, such that a variety of test units may be portably tested for errors without the need for preconfiguring the test units for testing.

16 Claims, 4 Drawing Sheets

METHOD AND SYSTEM FOR ERROR DETECTION IN TEST UNITS UTILIZING PSEUDO-RANDOM DATA

BACKGROUND OF THE INVENTION

1. Technical Field

The present invention relates to integrated circuits and planars. In particular, the present invention relates to improved methods and systems for detecting defects within integrated circuits and planars. More particularly, the present invention relates to pseudo-random number generators utilized in testing integrated circuits and planars at the system level.

Still more particularly, the present invention relates to the automated testing of integrated circuits and planars for defects by using pseudo-random number generators and minimal supporting logic. The present invention also relates to a method and system for the isolation and testing of defects which manifest as data errors within integrated circuits and planars.

2. Description of the Related Art

As the integrated circuit art has advanced, more and more circuit devices, and consequently more and more circuit functions, have been placed on single chips. These developments have created problems in the testing of such chips. For example, while the testing of even an extremely large memory array chip may be relatively straightforward, a chip that integrates various types of functions, including an embedded memory array and logic, may pose problems for the circuit designer/tester who desires adequate testability of embedded structures. For example, embedded memory arrays typically possess far fewer input/output (I/O) pins available for the circuit tester than a memory array occupying a stand alone chip.

Control logic, such as arbitration, data routing, and bus interface unit logic, is also difficult to verify due to the increasing complexity of such units. As complexity has increased, the level of difficulty of error-free designs has also rapidly increased due to an increasing number of available scenarios (including timing windows), some of which may be overlooked by the designer. Verifying that the logic operates properly is thus more difficult due to the coverage problem (i.e., ensuring that all such timing windows have been exercised).

Complex planars (i.e., systems) also pose numerous verification problems. Not only must each pad and connector be verified (which is a relatively simple process, typically carried out by a bed-of-nails type of analyzer), but analog phenomena such as crosstalk and thermal problems must also be considered. Such analog phenomena and thermal problems may be very difficult to isolate.

When initially implementing new systems that possess integrated circuit components, the initial start up process may be riddled with difficulties due to defects present in the integrated circuits, memory units, planars, and other components within the system itself. Most defects at the system level can be detected as data corruption errors (i.e., returned data not matching expected data). Other types of errors/bugs fall into the livelock/deadlock category.

Depending upon the severity of the defects, debugging is largely a matter of tedious trial and error. The debugger utilized by the designer is essentially a program or programs that can be utilized to detect, trace, and eliminate errors in computer programs or other software. Automated data-checking schemes which provide sophisticated bit error detection/correction can be thrown off by multiple bit errors or even a single bit error in a checksum field, as well as scenarios where the data is parity-correct but still does not match expected data.

Thus, from the foregoing it can be appreciated that a need exists in the semiconductor art for testing structures and corresponding testing methods which allow for testing of multiple integrated circuit and planar structures.

SUMMARY OF THE INVENTION

It is therefore an object of the invention to provide an improved method and system for detecting defects within integrated circuits and planars at the system level.

It is another object of the invention to provide an improved method and system for detecting defects manifesting as data errors within and across integrated circuits and planars through the utilization of pseudo-random number generators and minimal supporting logic.

It is still another object of the invention to provide an improved and highly-portable method and system for the isolation and testing of defects manifesting as data errors within and across integrated circuits and planars at the system level.

The above and other objects are achieved as is now described. A method and system in an integrated circuit for the detection of defects within integrated circuits and planars are disclosed. Initially, pseudo-random data is generated. Thereafter, the pseudo-random data is transferred to a bus interface unit that determines, based upon the pseudo-random data, a particular transaction that may be injected upon a test unit by the bus interface unit. Expected results of all types of transactions that may be injected upon the test unit are predetermined. The particular transaction is then injected upon the test unit. Such transactions can include transactions such as a bus store or bus load. The results of the particular transaction upon the test unit are then compared with the expected results, wherein a mismatch between the expected results and the results of the particular transaction upon the test unit exposes an error within the test unit, such that a variety of test units may be portably portably tested for errors without the need for preconfiguring the test units for testing.

Thus, initially an original sequence of pseudo-random number data generated by the pseudo-random number generator (PRNG) is supplied to the bus interface unit (BIU), along with other necessary data (size of the transfer, starting address, etc., all of which are to be generated in a random fashion by the PRNG). The BIU then "packages" this information into the appropriate sequence of signals at the bus level to implement a store operation. Handshaking is required between the PRNG and the BIU because the BIU may have to stall for arbitration purposes, etc. Minimal information representing the PRNG seed is stored in dedicated internal memory.

Multiple such stores by the BIU may occur back-to-back. The number of completed stores beginning at the saved seed value must also be stored in dedicated internal memory. After a sequence of one or more stores is completed by the PRNG/BIU, the saved seed is restored to the PRNG, and the PRNG requests the appropriate load to the BIU which will "package" this information into a load on the system bus, which will re-fetch the corresponding data previously written (under control of the same seed). The PRNG then re-creates the original sequence of data, guided by handshaking from the BIU, to compare word-by-word to the data returned from the load, wherein differences between the sequences of data are noted as potential error defects.

In its simplest form, one store followed by one load is performed repeatedly, which is sufficient to detect some planar/integrated circuit/memory errors. However, in order to fully stress system logic, which generally requires exposing timing windows, an arbitrarily large number of stores can be executed back-to-back before any loads are performed. It is unnecessary for all loads to be performed before the next store; any permutation of loads and stores is possible. Furthermore, random data-less transactions (such as synchronization commands, data cache operations, etc.) can be injected between any of the stores and loads. In this manner, a great deal of randomization of system traffic is provided, allowing for the exercising of many timing windows and stressful internal conditions.

BRIEF DESCRIPTION OF THE DRAWINGS

The novel features believed characteristic of the invention are set forth in the appended claims. The invention itself, as well as a preferred mode of use, further objects, and advantages thereof, will best be understood by reference to the detailed description of an illustrative embodiment when read in conjunction with the accompanying drawings, wherein:

DETAILED DESCRIPTION OF PREFERRED EMBODIMENT

Figure 1:
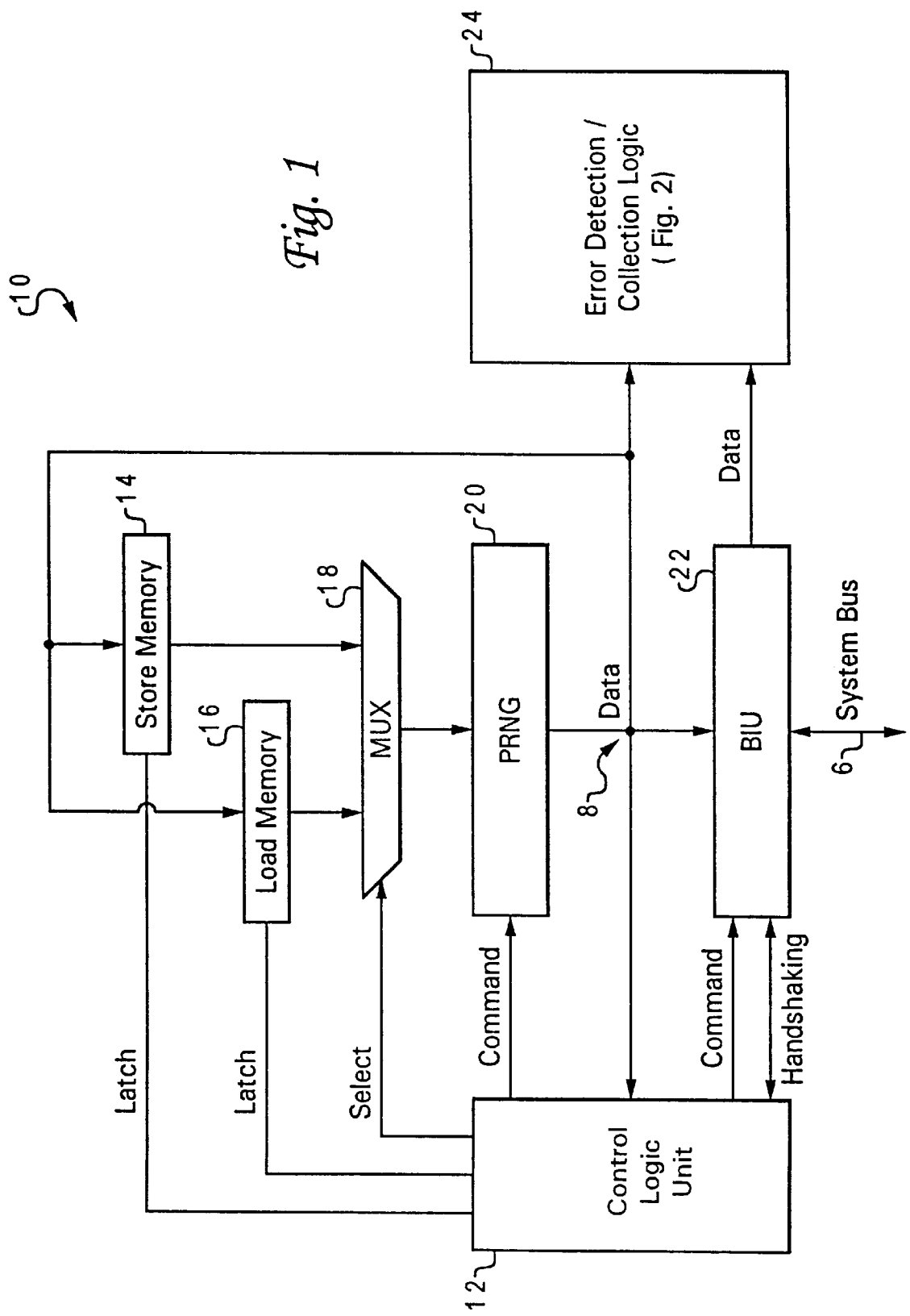
FIG. 1 illustrates a high-level block diagram of an error detection scheme for detecting defects within integrated circuits and planars, according to a preferred embodiment of the present invention.

FIG. 1 illustrates a high-level block diagram 10 of an error detection scheme for detecting defects within integrated circuits and planars, in accordance with a preferred embodiment of the present invention. The error detection scheme depicted in FIG. 1 includes a pseudo-random number generator (PRNG) 20 which transfers data to a bus interface unit (BIU) 22. PRNG 20 is under the control of a control logic 12, which causes PRNG 20 to generate a new data pattern or optionally, to load data present from the output of the multiplexor (MUX) 18. Control unit 12 contains control logic. The output of PRNG 20 feeds BIU 22, control unit 12—load memory 16 and store memory 14. The output of PRNG 20 contains instructions which informs control unit 12 of the number of sequential stores or loads to perform before switching modes. The memory formed by load memory 16 and store memory 14 is utilized to save a value contained within PRNG 20 before it switches modes (load to store, or store to load), which enables PRNG 20 to continue its overall store sequence unaltered (even though loads may be interspersed within the stores), and to be able to recreate the load address, size, and expected data so that the loads will have a 1-to-1 correspondence with the stores.

Control unit 12 further supplies control information to BIU 22. Such control information includes data such as when to initiate (or another type of transaction), and when the starting address or size for the load/store is available on data bus 8 which is located between PRNG 20 and control unit 12, BIU 22, and error detection/collection logic 24. Note that error detection/collection logic 24 is illustrated in greater detail in FIG. 2 herein. Handshaking is required between BIU 22 and control unit 12 so that one will not proceed past the other in supplying/consuming data. A data buffer may be employed along any of the data paths. Additionally, BIU 22, or minimal logic located along the data path from PRNG 20, may be necessary to modify some of the data emanating from PRNG 20 in order to limit transfer sizes or ensure that addresses presented are viable and unique. BIU 22 additionally receives data from a system bus along system bus line 6.

Figure 2:
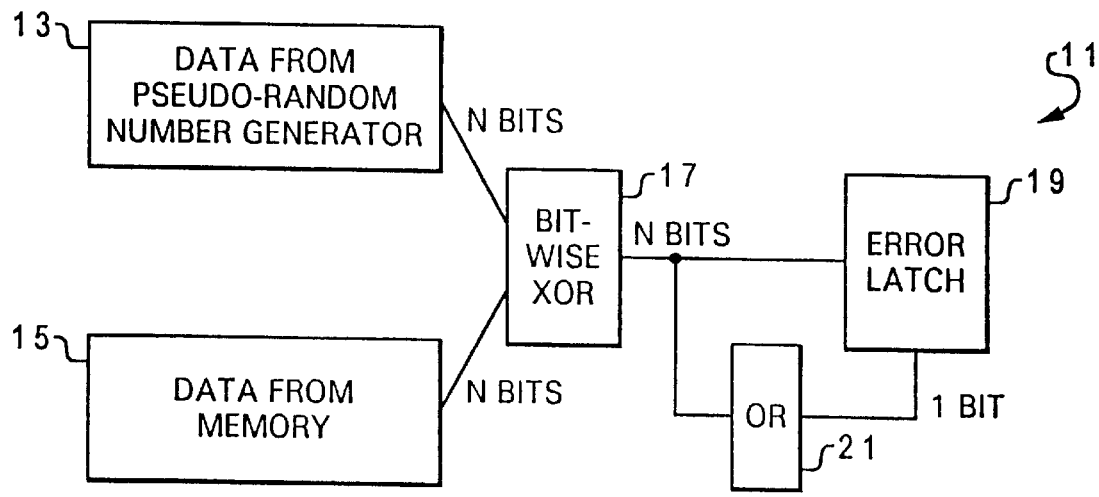
FIG. 2 illustrates a block diagram illustrative of an error detection scheme, in accordance with a preferred embodiment of the present invention.

With reference now to the figures and, in particular, with reference to FIG. 2, there is depicted a block diagram 11 illustrative of an error detection scheme, in accordance with a preferred embodiment of the present invention. The error detection scheme depicted in FIG. 2 specifically illustrates error detection/collection logic 24 depicted in FIG. 1. As illustrated at block 13, data from a pseudo-random number generator comprising "N" bits is fed to a bit-wise XOR logic 17. The pseudo-random number generator (not shown in FIG. 2) provides a pseudo-random number sequence, which is an ordered set of numbers that has been determined by some defined arithmetic process, but is effectively a random number sequence for the purpose for which it is required.

As depicted at block 15, data from a memory (not show) (fetched by a load from the BIU) comprising "N" bits is also fed to bit-wise XOR logic 17. Bit-wise XOR logic 17 implements an exclusive-OR logic function. An exclusive-OR logic function, well known in the art of digital and computer logic design, is a function whose output is a logic 1 when the two binary variables input to the XOR logic are different (i.e., when one binary variable input is 0 and the other is 1). Output from bit-wise XOR logic 17 is input to OR logic 21 and error latch 19.

Those skilled in the art will appreciate that the scheme depicted in FIG. 2 involves the utilization of a pseudo-random number generator (i.e., PRNG 20 of FIG. 1) and minimal supporting logic to automate testing and isolation of single-bit data or multiple-bit data errors. PRNG 20 of FIG. 1 is utilized to generate a sequence of random-looking data, which is "burst" written to sequential memory locations (the starting address of each store is randomized by PRNG 20, as is the size of the transfer). In data communications, a "burst" is essentially a sequence of signals counted as one unit in accordance with some specific criterion or measure. PRNG 20 of FIG. 1 is then reset and utilized to regenerate the same sequence of words (i.e., the sequence is deterministic), which is compared to the previously written words one-at-a-time as these words are read from memory. A comparison is performed in a bit-wise fashion, and any discrepancies are stored in a latch (i.e., error latch 19) as a bit-wise error vector.

Data from PRNG 20 of FIG. 1 is written to sequential memory addresses, then fetched back to be compared one word at a time to the data which was originally written to the memory, and which is regenerated in the same sequence by PRNG 20. These two words—the one produced by PRNG 20 and the one read back from memory (by the BIU) are then compared by XOR gates (i.e., bit-wise XOR logic 17). For an N-bit data path (i.e., N bits per word), the compare function, implemented by N 2-input XOR gates, possesses 2N input bits—N from memory read as illustrated at block 15, and N from the pseudo random number generator as depicted at block 13. The N output bits are tied to an N-bit error latch (i.e., error latch 19), which is triggered (i.e., enabled) by the single-bit output of the OR gate, which compares in parallel all N outputs of the XOR gates. Each XOR output is a "1" only if the two input bits differ. The single output of the OR gate (i.e., OR logic 21) will be a "1" if and only if one or more of the XOR output bits are "1".

Parity/checksum must be generated (by BIU 22 of FIG. 1 or by additional logic adjacent to PRNG 20 of FIG. 1) for each word of data supplied by PRNG 20. This ensures that data being written to memory will have correct parity, and that parity being read from memory can be checked with the correct parity generated from PRNG 20. A "word" of data as utilized herein refers to a the full data bus width, including parity. Data from PRNG 20 includes correct parity. Parity is thus a data transmission attribute utilized to ensure error-free transmission.

A parity error is an error that occurs when received data does not have the parity expected by the receiving system. A parity error can be caused by one or more bits of the data path being at an improper level, i.e., these bits are at a bus voltage which will result in their being interpreted as one value (say a "0"), while the transmitter actually sent a different value (say a "1"). The term "checksum" as utilized herein refers to a function of a group of data, and is utilized for checking purposes. In error detection, a checksum is essentially a function of all bits in a block. If the written and calculated sums do not agree, an error is indicated.

Note also that system errors may include cases where the returned data, though parity-correct, does not match the expected data due to errors in routing, etc. These errors too will be caught by the scheme; one large benefit of using a PRNG rather than simply shifting a sequence of alternate 0's and 1's is that virtually all data patterns will be unique, hence any such routing or buffering error which incorrectly swaps data is very likely to be caught as a multiple-bit data error.

Errors are saved as bit vectors containing a "1" for each bit in discrepancy, and a "0" for each bit which matches. Such a technique is extremely useful in the debugging process because it correctly reports bit error locations for 1 to N discrepancies, regardless of whether the errors are in parity/checksum fields or not. It can also find fails very quickly—one is no longer required to wait for fails during program execution, but can kick off this test mode and let the hardware do all the work (which will expose many difficult to attain stressful conditions), then scan out the contents of error latch 19 and determine which, if any, bits are in error. The scheme can progress through an arbitrarily large number of errors without halting, or optionally can halt after the first error is detected.

The ability to progress testing past the first error greatly reduces time spent debugging intermittent fails such as "crosstalk" or thermal problems. The act of "debugging" can be thought of as acting to detect and correct errors in software or system configurations. The scheme depicted in block diagram 10 of FIG. 1 can be set to write pseudo-random data to arbitrarily large sequences of memory, read the data a back and compare, and subsequently repeat the sequence as necessary (optionally beginning the number sequence with a different seed value) until the fail manifests. Further, multiple back-to-back stores followed by multiple loads (or any permutation thereof) may be carried out, thereby greatly stressing arbitration and control logic.

Figure 3:
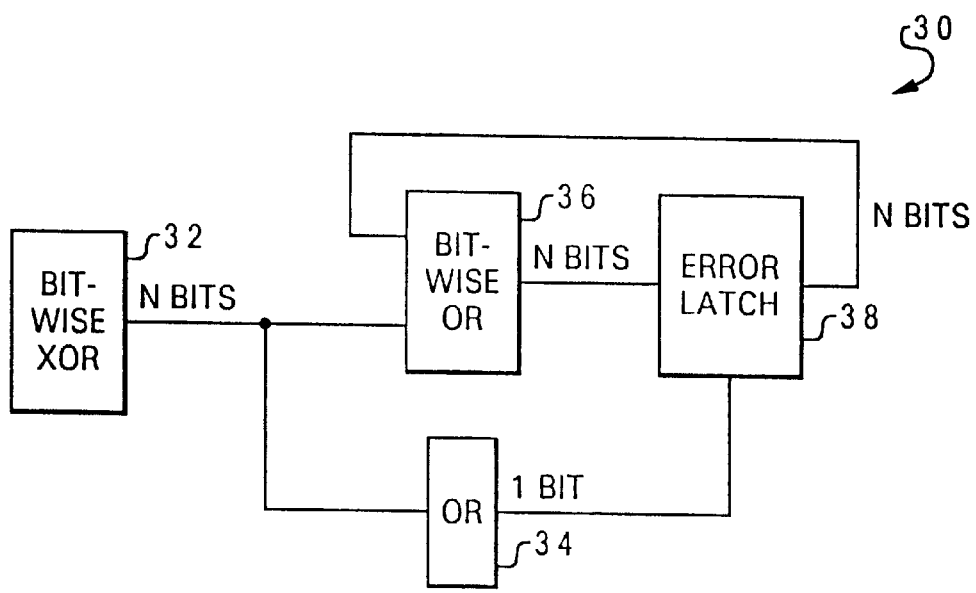
FIG. 3 depicts a block diagram illustrative of a rigorous error detection scheme, in accordance with a preferred embodiment of the present invention.

FIG. 3 depicts a block diagram 30 illustrative of a rigorous error detection scheme, in accordance with a preferred embodiment of the present invention. A more rigorous scheme is implemented, as shown in FIG. 3, by providing a feedback loop from the output of error latch 38 through bit-wise OR logic 36, the second input of which derives from corresponding output bits of XOR gates (i.e., bit-wise XOR logic 32), and passing the output of these OR gates to the inputs of error latch 38. Those skilled in the art will appreciate that the error detection scheme depicted in FIG. 3 can be utilized in accordance with the high-level error detection scheme presented in FIG. 1.

Bit-wise XOR logic 32 of FIG. 3 is analogous to bit-wise XOR logic 17 of FIG. 2. Although not depicted in FIG. 3, those skilled in the art will appreciate that bit-wise XOR logic 32 receives as input data from a pseudo-random number generator (e.g., PRNG 20 of FIG. 1) and from memory as depicted in FIG. 1. Error latch 38 of FIG. 3 is analogous to error latch 19 of FIG. 2. Thus, the logic depicted in FIG. 3 details added logic between the XOR gates and error latch of FIG. 2. Such latches typically comprise bistable circuits that are set and reset by appropriate input signals, or that record the status of a particular signal until the latch is reset.

In FIG. 3, an N-bit to 1-bit OR gate is still required to trigger error latch 38. The benefit of the scheme illustrated in FIG. 3 is that the test logic can be allowed to run indefinitely without losing the location of any bit errors, and without requiring numerous sets of latches implemented as a sort of stack, which is undesirable since it limits one to a fixed number of fails (i.e., equal to a stack depth), plus it may require more total logic. Errors such as bad wiring, bad connections or bad memory units will most likely appear in the error vector within a few dozen cycles, while intermittent fails will most likely require thousands of cycles to manifest.

Thus, the scheme depicted in FIG. 3 can be utilized to repair difficult errors based on the error vector obtained after a short run, or to isolate intermittent errors or complex timing window type of errors from the error vector obtained after much longer runs. Because error latch 38 is implemented as an accumulator, one may trigger the error latch every cycle and not cause any loss of data or result in the generation of incorrect data. Although this results in a great deal of redundant and unnecessary latching, those skilled in the art can readily appreciate that such a scheme reduces required logic and propagation delays.

The user may also wish to save the addresses (and/or transfer size) at which errors are detected. This can be accomplished by providing an address latch connected to the currently driven address value (i.e., saving the beginning address of a burst read will suffice), which must be triggered upon detection of an error. Saving the address upon every error detection is undesirable because, in the case of a hard error, one may detect the same error many times. Thus, the address and error latches will redundantly trigger many times. While this will not create any problems or cause any loss of data, this illustrates the occasional need to be able to detect unique errors as the criteria for latching an address. For this matter, latching the accumulated error vector in the case of non-unique errors (i.e., errors which have already been accumulated in the error latch) is redundant. The error vector will not be any different after the latching. Thus, the error vector need only be updated upon detection of a unique error, and the same "unique error detection circuit" can be utilized to latch both the error vector and the failing address/transfer size.

Figure 4:
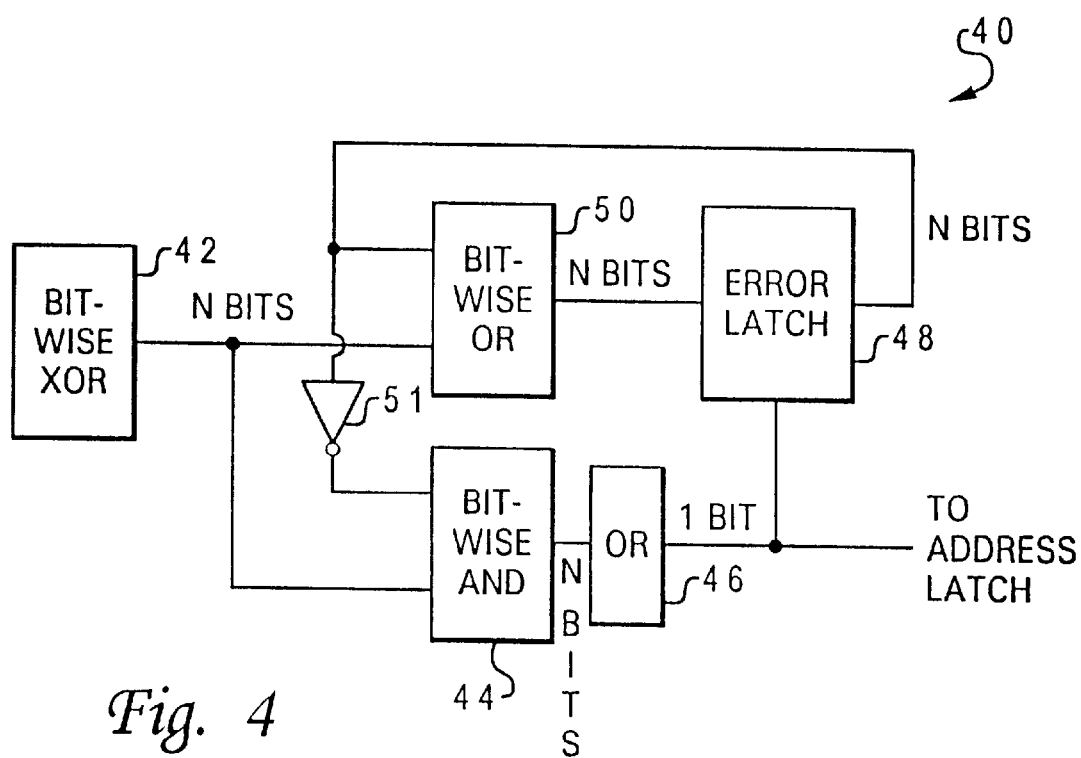
FIG. 4 illustrates a block diagram illustrative of an error detection scheme coupled to an address latch, in accordance with a preferred embodiment of the present invention.

FIG. 4 illustrates a block diagram 40 illustrative of an error detection scheme coupled to an address latch, in accordance with a preferred embodiment of the present invention. In the scheme depicted in block diagram 40, an accumulated error vector (i.e., in error latch 48) is utilized to mask the current error vector (i.e., output from bit-wise XOR logic 42). This is accomplishing by "ANDing" the current vector with the inverse of the accumulated error vector. A new error comprises an error in which the accumulated error vector contains a "0" and the current error vector contains a "1" for at least one bit. Thus, the single bit output of OR gate 46 will only be set if a new error has been detected.

Thus, in the scheme depicted in FIG. 4, signals are sent as output from bit-wise XOR logic 42 to bit-wise AND logic 44 and to bit-wise OR logic 50. Output from bit-wise AND logic 44 is sent as N bits to OR gate 46 whose output is utilized to trigger address latching logic and error latch 48. Output from error latch 48 (i.e., N bits) is input to bit-wise OR logic 50 and inverter 51. Output from inverter 51 is input to bit-wise AND logic 44. Thus, output from bit-wise XOR logic 42 is "ANDed" with output from inverter 51 by bit-wise AND logic 44. Propagation delay with this scheme can be decreased by adding another latch directly after the bit-wise XOR logic 42 and before OR gate 46, or by adding pipeline latches within OR gate 46. This may prove crucial, as propagation delay through OR gate error-latch trigger will increase with increasing N.

Figure 5:
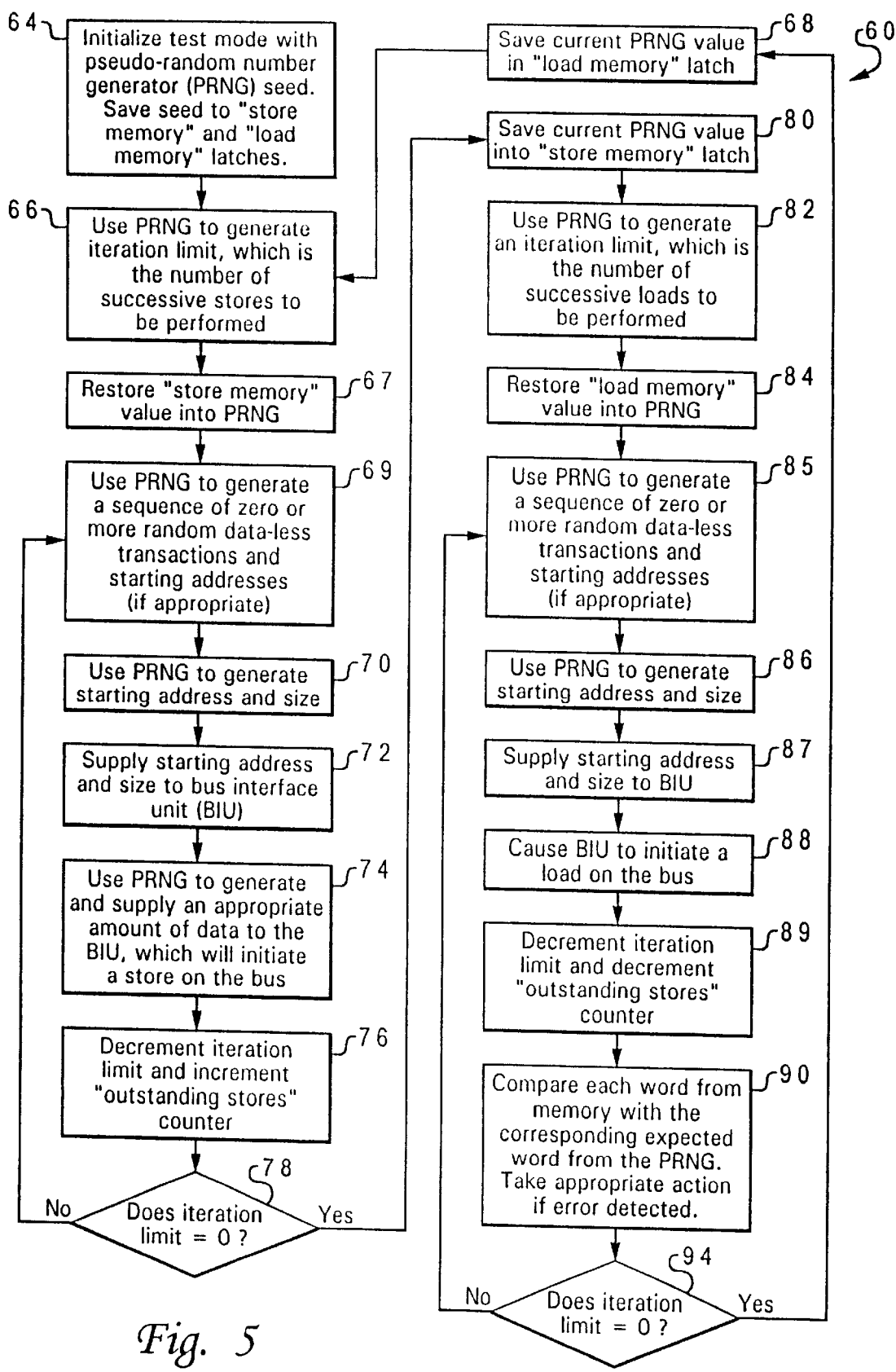
FIG. 5 depicts a flowchart of operations illustrating a method for detecting defects in integrated circuits and planars, in accordance with a preferred embodiment of the present invention.

FIG. 5 depicts a flowchart of operations 60 illustrating a method for detecting defects in integrated circuits and planars, in accordance with a preferred embodiment of the present invention. It can be appreciated by those skilled in the art that FIG. 5 presents a self-consistent sequence of steps leading to a desired result. The steps are those requiring physical manipulation of physical quantities. Usually, although not necessarily, these quantities take the form of electrical or magnetic signals capable of being stored, transferred, combined, compared, and otherwise manipulated. It has proven convenient at times by those skilled in the art, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as "generating," "loading," or "comparing," which are commonly associated with mental operations performed by a human operator. No such capability of a human operator is necessary or desirable in most cases in any of the operations described herein which form part of the present invention; the operations are machine operations. The operations depicted in FIG. 5 may also be carried out by the dedicated logic illustrated in FIG. 1. In all cases, the distinction between the method operations in operating a computer and the method of computation itself should be borne in mind. The present invention relates to method steps for operating a computer in processing electrical or other (e.g. mechanical, chemical) physical signals to generate other desired physical signals.

According to a preferred embodiment of the present invention, a method and system are provided for the detection of defects. These defects are manifested as data errors, which can be identified as any case where load data and parity do not match expected data and parity. Initially, a sequence of pseudo-random number data sets generated by the PRNG are presented to the BIU. The BIU packages each set of data into stores on the corresponding system bus. After completing the sequence of stores, the PRNG is reset to its initial value, and the BIU is made to issue loads on the system bus in order to re-fetch the previously stored data sets. As these loads complete, their data is compared with the expected data (i.e., regenerated by the PRNG). Any discrepancy is saved in a cumulative bit-error latch, which is particularly useful in determining planar/memory faults. An error is then flagged, and optionally the failing address, transaction size, and so forth are stored. Any permutation of loads and stores of any size can be attained, thereby exposing many stressful timing windows. Further, additional non-data system traffic can be injected between the loads and stores to cause further stress to the system.

Thus, as depicted at block 64, the process is initiated. The test mode is initialized with a pseudo-random number generator seed. A pseudo-random number generator such as PRNG 20 of FIG. 1 can be utilized to initialize the test mode. The seed is saved to "store memory" and "load memory" latches. As illustrated at block 66, the PRNG is utilized to create an iteration limit, which represents the number of successive stores to be performed. Following creation of the iteration limit, an operation is performed, as indicated at block 67, to restore the "store memory" value into the PRNG. As indicated at block 69, the PRNG is utilized to generate a sequence of zero or more data-less transaction types and addresses (if appropriate). The operation described at block 69 is implemented to indicate an ability to inject random data-less transactions on the bus.

The PRNG also generates, as described at block 70, a starting address and size for the current store. As illustrated at block 72, the PRNG supplies this information (i.e., starting address and size) to the BIU (e.g., BIU 22 of FIG. 1). Thereafter, as depicted at block 74, the PRNG then begins supplying data (as many words as necessary to fill the size) to the BIU which will initiate a store on the bus. The BIU maps this to a system-bus store. This store process is repeated until the iteration limit is met, incrementing an "outstanding stores" counter (representing the number of stores completed which have not yet been loaded) with each store, as illustrated at block 76. As depicted at block 78, a test is performed to determine whether or not the iteration limit encountered is a "0" value. If so, then the process continues to block 80. If not, then the process, as illustrated beginning at block 69, is repeated.

As depicted at block 80, the current value in the PRNG is saved to the "store memory" latch (i.e., since it will be restored to the PRNG, as indicated at block 67, when the scheme begins storing again). After completion of the operation described at block 80, the PRNG subsequently generates an iteration limit for the number of successive loads to be performed (which must be forced to be less than or equal to the value in the "Outstanding Stores" counter), as illustrated at block 82. Thereafter, The PRNG is loaded with the contents of "load memory," as described at block 84. Then, as indicated at block 85, the PRNG is utilized to generate a sequence of zero or more random data-less transaction type and starting address (if appropriate).

The operation described at block 85 is implemented to indicate an ability to inject random data-less transactions on the bus. At this point in the process, as depicted at block 86, the PRNG generates a starting address and size. The starting address and size are then supplied to the BIU, as depicted at block 87. Thereafter, as depicted at block 88, the BIU will initiate a load on the bus. Note that no data must be supplied to the BIU for a load, only the size and starting address, as depicted in blocks 86 and 87. PRNG supplies an appropriate amount of data to the BIU, which will initiate a load on the bus. As subsequently illustrated at block 89, the iteration limit and "outstanding stores" counter are decremented.

As data returns from this load, it is compared word-by-word to data generated by the PRNG, as described at block 90. Each word from memory is compared with the corresponding expected word derived from the PRNG. If any error is detected, an appropriate action is performed (e.g., halt the system, latch the error bit(s), latch the error address, continue testing and accumulating bit errors). Finally, as described at block 94, if the iteration limit is equivalent to a "0" value, the operation illustrated at block 68 is processed. As illustrated at block 68, the current PRNG value is saved in the "load memory" latch, since the current PRNG value is restored to PRNG 20 when the loading begins to occur. Following processing of the operation depicted at block 68, the operations as illustrated, beginning with block 66, are repeated. If the iteration limit, as indicated at block 94, is not equivalent to a "0" value, then the process depicted beginning at block 85 is repeated.

The overall process can be repeated as necessary (i.e., utilizing different seeds, which will result in different iteration limits, starting addresses, and transfer sizes) with no loss of bit errors, as long as the error latch is not reset. Depending upon a particular implementation, the error vector may be latched every cycle, upon any error detection, or only upon detection of a new error. The address of the fail and/or the transfer size may be latched upon detection of any error or only new errors as well. Further, the scheme may be allowed to run indefinitely even after error detection (by using the accumulator), or may be forced to trap after the first (or "nth") error is detected.

Those skilled in the art will appreciate that additional complexity can be added to the controller such that a set of transactions requiring no data (such as synchronization commands, data cache block flushes, etc.) can be issued between any of the loads and stores, and can be randomized by utilizing the output of the PRNG. This complexity can yield yet more system-level stress, possibly exposing more timing windows and system-level defects. This complexity can be enabled/disabled by initialization of the control logic (e.g., control logic contained in control unit 12 of FIG. 1), and is depicted in blocks 69 and 85.

Based on the foregoing, those skilled in the art will further appreciate that the method and system provided herein requires no manual effort to isolate data errors (i.e., no manual checksum calculations, etc.). In addition, the method and system provided herein accurately locates errors anywhere from a single bit to a full data path width, even in checksum fields, and in cases where parity is correct but actual data does not match expected data, which would make bit error isolation utilizing checksum comparisons impossible.

Additionally, the method and system described herein provides an automated technique which quickly passes data to and from memory (through an arbitrarily-complex set of bridge and control integrated circuits). The test mode can be run as long as necessary without having to save any data other than the single error vector. It is not necessary that the debugger take up space in hard disks with logic analyzer readings. The methodology described and illustrated herein can greatly stress control logic (especially bridge chips, memory controllers, and arbiters), thereby exercising many conditions and timing windows which would otherwise be difficult to expose. Furthermore, the sequence can be easily regenerated by saving merely the initial value used to initialize the PRNG.

In addition, those skilled in the art will appreciate that the advantage of supplying data to the BIU in the manner described herein is that it is unnecessary for the implemented method and system to know the type of bus the data is being transferred to/from. Thus, those skilled in the art will appreciate that the method and system described herein is portable to any bus in any system. The BIU must only provide a simple interface to/from the implemented method and system described herein, which does not substantially increase complexity. Those skilled in the art will further appreciate that added flexibility can be incorporated into the testing scheme described herein. For example, testing can be halted at an arbitrary point such as after N errors, or after no errors (i.e., run for N iterations), or after detecting a particular pattern.

While the invention has been particularly shown as described with reference to a preferred embodiment, it will be understood by those skilled in the art that various changes in form and detail may be made therein without departing from the spirit and scope of the invention. It is therefore contemplated that such modifications can be made without departing from the spirit or scope of the present invention as defined in the appended claims.

What is claimed is:

1. A method for the detection of errors within a test unit, said method comprising the steps of:
    predetermining expected results of all types of transactions that may be injected upon said test unit;
    generating pseudo-random data;
    transferring said pseudo-random data to a bus interface unit that determines, based upon said pseudo-random data, a particular transaction that may be injected upon a test unit by said bus interface unit;
    injecting said particular transaction upon said test unit; and
    comparing the results of said particular transaction upon said test unit with said expected results, wherein a mismatch between said expected results and the results of said particular transaction upon said test unit exposes an error within said test unit.

2. The method of claim 1 wherein the step of generating pseudo-random data further comprises the step of:
    generating pseudo-random data from a pseudo-random number generator.

3. The method of claim 2 wherein the step of comparing the results of said particular transaction upon said test unit with said expected results, further comprises the step of:
    comparing the results of said particular transaction upon said test unit with said expected results utilizing comparison logic.

4. The method of claim 3 further comprising the step of controlling the interaction of data flowing between said pseudo-random number generator, said comparison logic, and said bus interface unit.

5. The method of claim 4 wherein the step of comparing the results of said particular transaction upon said test unit with said expected results utilizing comparison logic, further comprises the step of:
    comparing the results of said particular transaction upon said test unit with said expected results utilizing comparison logic, wherein said comparison logic comprises:
        an accumulator latch which upon detection of an appropriate error, indicates on a per-bit basis which bits of a data word width witness an error, thereby isolating single bit errors; and
        error detection logic for differentiating new bit errors from previously latched errors, such that a number of errors flagged is minimized.

6. The method of claim 2 wherein the step of generating pseudo-random data from a pseudo-random number generator, further comprises the step of:

generating pseudo-random data from a pseudo-random number generator, in response to initializing said pseudo-random number generator with a single seed.

7. The method of claim 6 further comprising the step of regenerating said pseudo-random data from said single seed in order to recreate said error for detailed logic tracing.

8. The method of claim 6 further comprising the step of regenerating said pseudo-random data from said single seed in order to verify a prior correction of a test unit.

9. A system for the detection of errors within a test unit, said system comprising:

means for predetermining expected results of all types of transactions that may be injected upon said test unit;

means for generating pseudo-random data;

means for transferring said pseudo-random data to a bus interface unit that determines, based upon said pseudo-random data, a particular transaction that may be injected upon a test unit by said bus interface unit;

means for injecting said particular transaction upon said test unit; and means for comparing the results of said particular transaction upon said test unit with said expected results, wherein a mismatch between said expected results and the results of said particular transaction upon said test unit exposes an error within said test unit.

10. The system of claim 9 wherein said means for generating pseudo-random data further comprises:

means for generating pseudo-random data from a pseudo-random number generator.

11. The system of claim 10 wherein said means for comparing the results of said particular transaction upon said test unit with said expected results, further comprises comparison logic.

12. The system of claim 11 further comprising control means for controlling the interaction of data flowing between said pseudo-random number generator, said comparison logic, and said bus interface unit.

13. The system of claim 12 wherein said comparison logic comprises:

an accumulator latch which upon detection of an appropriate error, indicates on a per-bit basis which bits of a data word width witness an error, thereby isolating single bit errors; and error detection logic for differentiating new bit errors from previously latched errors, such that a number of errors flagged is minimized.

14. The system of claim 10 said means for generating pseudo-random data from a pseudo-random number generator, further comprises:

means for generating pseudo-random data from a pseudo-random number generator, in response to initializing said pseudo-random number generator with a single seed.

15. The system of claim 14 further comprising means for regenerating said pseudo-random data from said single seed in order to recreate said error for detailed logic tracing.

16. The system of claim 14 further comprising means for regenerating said pseudo-random data from said single seed in order to verify a prior correction of a test unit.

* * * * *